(12) United States Patent
Sun

(10) Patent No.: US 10,713,999 B2
(45) Date of Patent: Jul. 14, 2020

(54) OLED DISPLAY PANEL, DRIVING METHOD THEREOF AND DISPLAY DEVICE

(71) Applicant: BOE Technology Group Co., Ltd., Beijing (CN)

(72) Inventor: Yanliu Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 27 days.

(21) Appl. No.: 16/111,871

(22) Filed: Aug. 24, 2018

(65) Prior Publication Data
US 2019/0213948 A1 Jul. 11, 2019

(30) Foreign Application Priority Data
Jan. 5, 2018 (CN) .......................... 2018 1 0010708

(51) Int. Cl.
| | |
|---|---|
| G09G 3/3208 | (2016.01) |
| G06F 3/041 | (2006.01) |
| H01L 27/32 | (2006.01) |
| G06K 9/00 | (2006.01) |
| H01L 27/146 | (2006.01) |

(52) U.S. Cl.
CPC ......... *G09G 3/3208* (2013.01); *G06F 3/0416* (2013.01); *G06K 9/0004* (2013.01); *H01L 27/323* (2013.01); *H01L 27/3234* (2013.01); *G09G 2354/00* (2013.01); *G09G 2360/145* (2013.01); *H01L 27/14678* (2013.01)

(58) Field of Classification Search
CPC .............. G06F 3/0416; G06K 9/0004; G09G 2354/00; G09G 2360/145; G09G 3/3208; H01L 27/14678; H01L 27/323; H01L 27/3234

USPC ................................................. 345/170–178
See application file for complete search history.

(56) References Cited

U.S. PATENT DOCUMENTS

| | | | |
|---|---|---|---|
| 10,303,921 B1* | 5/2019 | He ................... | G02F 1/133526 |
| 2010/0067757 A1* | 3/2010 | Arai ..................... | G06K 9/0004 |
| | | | 382/128 |

(Continued)

FOREIGN PATENT DOCUMENTS

| | | |
|---|---|---|
| CN | 106298859 A | 1/2017 |
| CN | 106773273 A | 5/2017 |

(Continued)

OTHER PUBLICATIONS

Office Action for 201810010708.3 dated Oct. 9, 2019.
(Continued)

*Primary Examiner* — Tony O Davis
(74) *Attorney, Agent, or Firm* — Arent Fox LLP; Michael Fainberg

(57) ABSTRACT

The disclosure discloses an OLED display panel, a driving method thereof and a display device. In a texture recognition period, a first light emitting element in a texture recognition area is controlled to be in an off state, wherein the first light emitting element includes at least a light emitting element of which a spacing from an edge of a pinhole imaging area is closest in the texture recognition area; and then an image of an object, formed through the pinhole imaging area, is obtained by an image sensor, the object being in the texture recognition area and above the display panel, so as to implement the texture collection and recognition functions.

20 Claims, 3 Drawing Sheets

(56) References Cited

U.S. PATENT DOCUMENTS

| | | | | |
|---|---|---|---|---|
| 2010/0079696 A1* | 4/2010 | Hwu | G02B 27/1066 | |
| | | | 349/57 | |
| 2014/0036168 A1* | 2/2014 | Ludwig | G06F 3/0412 | |
| | | | 349/12 | |
| 2014/0355846 A1* | 12/2014 | Lee | G06K 9/0004 | |
| | | | 382/124 | |
| 2015/0109214 A1* | 4/2015 | Shi | G06F 3/044 | |
| | | | 345/173 | |
| 2017/0017824 A1 | 1/2017 | Smith et al. | | |
| 2017/0300736 A1* | 10/2017 | Song | G06K 9/00033 | |
| 2018/0012069 A1* | 1/2018 | Chung | A61B 5/1172 | |
| 2018/0060641 A1* | 3/2018 | Kim | G06K 9/00013 | |
| 2018/0096186 A1* | 4/2018 | Mienko | G06K 9/00013 | |
| 2018/0157889 A1* | 6/2018 | MacDonald | G06K 9/0008 | |
| 2019/0156097 A1 | 5/2019 | Liu et al. | | |
| 2019/0213948 A1* | 7/2019 | Sun | H01L 27/323 | |
| 2019/0272408 A1* | 9/2019 | Ding | G06K 9/0004 | |

FOREIGN PATENT DOCUMENTS

| | | |
|---|---|---|
| CN | 206292811 U | 6/2017 |
| CN | 206431645 U | 8/2017 |

OTHER PUBLICATIONS

G.P. Darshan et al. "Effective fingerprint recognition technique using doped yttrium aluminate nano phosphor material" Journal of Colloid and Interface Science, Feb. 15, 2016.

Ai Junbo et al. "High-resolution Tactile Fingerprint Sensor" Electonics World Issue 4, Apr. 30, 2000.

* cited by examiner

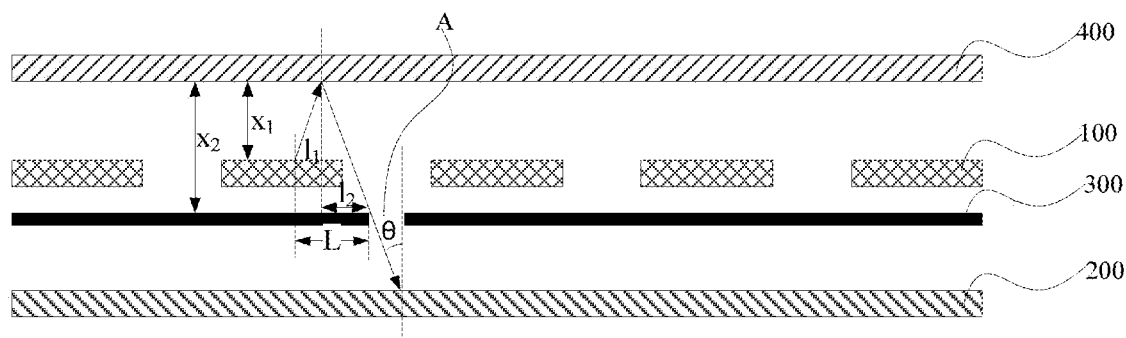
Fig.3
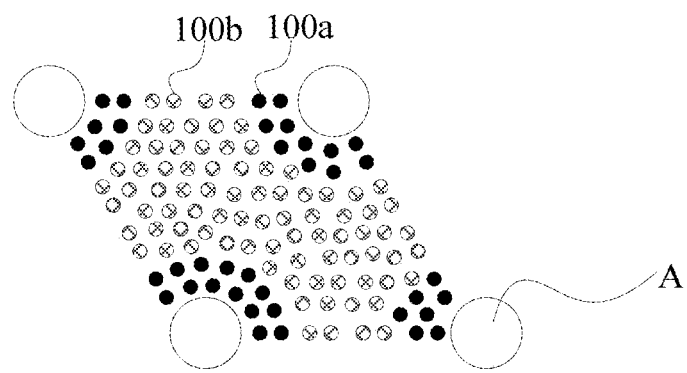
Fig.4
Fig.5

OLED DISPLAY PANEL, DRIVING METHOD THEREOF AND DISPLAY DEVICE

CROSS-REFERENCES TO RELATED APPLICATION

This application claims priority to Chinese patent application No. 201810010708.3 filed on Jan. 5, 2018, which is incorporated herein by reference in its entirety.

FIELD

The present disclosure relates to the field of display technologies, and particularly to an OLED display panel, a driving method thereof and a display device.

BACKGROUND

At present, the Organic Light-Emitting Diode (OLED) display panel is increasingly developing towards narrow bezel and all-screen display. For the traditional OLED display panel, the accessary fingerprint recognition, camera, microphone and the like existing in the all screen cannot adapt to the new user requirement. Thus, the development of the fingerprint recognition technology in the display (AA) area of the display panel is imperative, which can reduce the accessary area of the OLED display panel effectively and further achieve the all screen display.

SUMMARY

In one aspect, an embodiment of the disclosure provides a driving method of an OLED display panel, which includes: in a texture recognition period, controlling a first light emitting element in a texture recognition area to be in an off state, wherein the first light emitting element includes at least a light emitting element of which a spacing from an edge of a pinhole imaging area is closest in the texture recognition area; and obtaining, by an image sensor, an image of an object formed through the pinhole imaging area, the object being in the texture recognition area and above the display panel.

In a possible implementation, in the above driving method according to the embodiment of the disclosure, the first light emitting element includes all light emitting elements of which spacings from the edge of the pinhole imaging area are smaller than a preset spacing in the texture recognition area; the preset spacing L is determined by a following formula:

$$L=(x_1+x_2)*\tan\theta$$

wherein $x_2$ is a distance between a strong reflection interface in the OLED display panel and an upper surface of a light shading layer having the pinhole imaging area; $x_1$ is a distance between the strong reflection interface in the OLED display panel and an upper surface of the light emitting element; and $\theta$ is a maximum angle at which the image sensor in the OLED display panel receives light.

In a possible implementation, in the driving method according to the embodiment of the disclosure, the first light emitting element includes two rings of light emitting elements of which the center is the pinhole imaging area in the texture recognition area.

In a possible implementation, in the driving method according to the embodiment of the disclosure, the driving method further includes: in the texture recognition period, controlling a second light emitting element in the texture recognition area to be in a light emitting state, wherein the second light emitting element is another light emitting element than the first light emitting element in the texture recognition area.

In a possible implementation, in the driving method according to the embodiment of the disclosure, the second light emitting element includes at least one light emitting element located between two adjacent pinhole imaging areas in the texture recognition area.

In a possible implementation, in the driving method according to the embodiment of the disclosure, the number of the second light emitting elements between every two adjacent pinhole imaging areas is same in the texture recognition area.

In a possible implementation, the driving method according to the embodiment of the disclosure, further includes determining the texture recognition area in a display area of the OLED display panel; or taking the whole display area of the OLED display panel as the texture recognition area.

In a possible implementation, in the driving method according to the embodiment of the disclosure, determining the texture recognition area in the display area of the OLED display panel, includes: determining a touch area according to a touch module in the OLED display panel; and taking the touch area as the texture recognition area.

In another aspect, an embodiment of the disclosure further provides an OLED display panel, which is driven by the driving method according to the embodiment of the disclosure, where the OLED display panel includes: a plurality of light emitting elements, an image sensor, a light shading layer located between the image sensor and a layer where the light emitting elements are located and having at least one pinhole imaging area, and a strong reflection interface located at one side of the light emitting elements away from the light shading layer; wherein the at least one pinhole imaging area is located at gaps among the light emitting elements; the image sensor is configured, in a texture recognition period, to obtain an image of an object formed through the pinhole imaging area, the object being above the display panel; wherein in the texture recognition period, a first light emitting element in a texture recognition area is in an off state, the first light emitting element includes at least a light emitting element of which a spacing from an edge of the pinhole imaging area is closest in the texture recognition area.

In a possible implementation, in the OLED display panel according to the embodiment of the disclosure, the OLED display panel further includes a touch module located at one side of the light emitting elements away from the light shading layer, wherein the touch module is served as the strong reflection interface.

In a possible implementation, in the OLED display panel according to the embodiment of the disclosure, the first light emitting element includes all light emitting elements of which spacings from the edge of the pinhole imaging area are smaller than a preset spacing in the texture recognition area; the preset spacing L is determined by a following formula:

$$L=(x_1+x_2)*\tan\theta$$

wherein $x_2$ is a distance between a strong reflection interface in the OLED display panel and an upper surface of a light shading layer having the pinhole imaging area; $x_1$ is a distance between the strong reflection interface in the OLED display panel and an upper surface of the light emitting element; and $\theta$ is a maximum angle at which the image sensor in the OLED display panel receives light.

In a possible implementation, in the OLED display panel according to the embodiment of the disclosure, the first light emitting element includes two rings of light emitting elements of which the center is the pinhole imaging area in the texture recognition area.

In another aspect, an embodiment of the disclosure further provides a display device including an OLED display panel. The OLED display panel is driven by the driving method according to the embodiment of the disclosure. The OLED display panel includes: a plurality of light emitting elements, an image sensor, a light shading layer located between the image sensor and a layer where the light emitting elements are located and having at least one pinhole imaging area, and a strong reflection interface located at one side of the light emitting elements away from the light shading layer; wherein the at least one pinhole imaging area is located at gaps among the light emitting elements; the image sensor s configured to, in a texture recognition period, to obtain an image of an object formed through the pinhole imaging area, the object being above the display panel; wherein in the texture recognition period, a first light emitting element in a texture recognition area is in an off state, the first light emitting element includes at least a light emitting element of which a spacing from an edge of the pinhole imaging area is closest in the texture recognition area.

In a possible implementation, in the display device according to the embodiment of the disclosure, the OLED display panel further includes a touch module located at one side of the light emitting elements away from the light shading layer, wherein the touch module is served as the strong reflection interface.

In a possible implementation, in the display device according to the embodiment of the disclosure, the first light emitting element includes all light emitting elements of which spacings from the edge of the pinhole imaging area are smaller than a preset spacing in the texture recognition area; the preset spacing L is determined by a following formula:

$$L=(x_1+x_2)*\tan\theta$$

wherein $x_2$ is a distance between a strong reflection interface in the OLED display panel and an upper surface of a light shading layer having the pinhole imaging area; $x_1$ is a distance between the strong reflection interface in the OLED display panel and an upper surface of the light emitting element; and $\theta$ is a maximum angle at which the image sensor in the OLED display panel receives light.

In a possible implementation, in the display device according to the embodiment of the disclosure, the first light emitting element includes two rings of light emitting elements of which the center is the pinhole imaging area in the texture recognition area.

BRIEF DESCRIPTION OF THE DRAWINGS

FIG. 3 is a flow chart of a driving method according to an embodiment of the disclosure;

FIG. 4 is a schematic structural diagram of an OLED display panel according to an embodiment of the disclosure;

FIG. 5 is a schematic top view of an OLED display panel according to an embodiment of the disclosure.

DETAILED DESCRIPTION

In order to make the purposes, technical solutions and advantages of the disclosure clearer, the disclosure will be further described below in details in combination with the accompanying drawings. Obviously the described embodiments are a part of the embodiments of the disclosure but not all the embodiments. Based upon the embodiments of the disclosure, all of other embodiments obtained by those ordinary skilled in the art without creative work pertain to the protection scope of the disclosure.

The shapes and sizes of all the elements in the accompanying drawings do not reflect the actual proportion, and the purpose thereof is only intended to schematically illustrate the content of the disclosure.

In the pinhole imaging texture recognition, the texture recognition function may be integrated in the display area (AA area) of the display panel. But the strong reflection interface generally exists in the display module structure (MDL), which may causes the pattern of the light emitting element (EL) to image on the image sensor, to thereby cover the texture image, influence the definition of the texture image seriously, and lead to the problem of inaccurate texture recognition.

Figure 1:
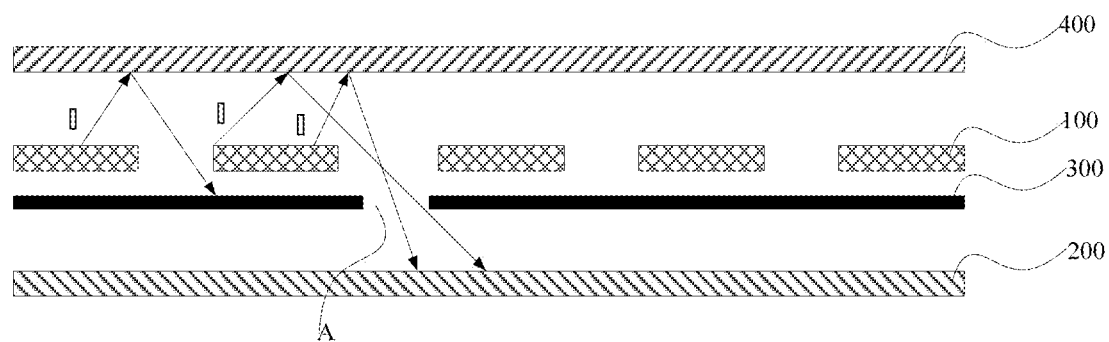
FIG. 1 is a schematic structural diagram of an OLED display panel in the related art.

The display panel with the pinhole imaging texture recognition function, as shown in FIG. 1, includes: a plurality of light emitting elements 100, an image sensor 200, a light shading layer 300 located between the image sensor 200 and a layer where the light emitting elements 100 is located and having at least one pinhole imaging area A, and a strong reflector 400 located at one side of the light emitting elements 100 away from the light shading layer 300. The strong reflection interface 400 is generally a touch module or another component attached to the display surfaces of the light emitting elements 100.

Figure 2:
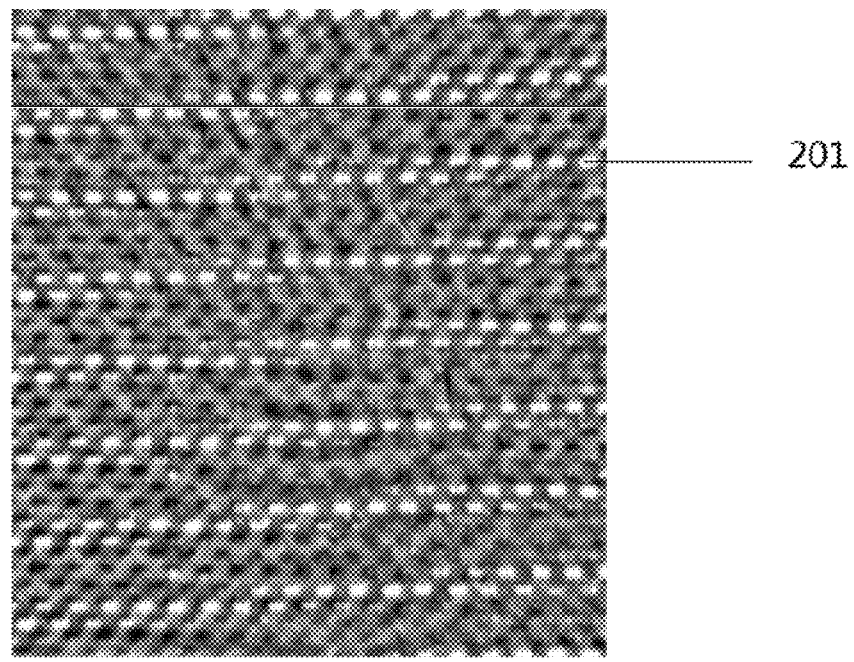
FIG. 2 is a schematic diagram of the texture image obtained by the OLED display panel in the related art.

Specifically, as shown in FIG. 1, the light emitting elements 100 emit the light towards all directions. The light □ is reflected by the strong reflection interface 400 to the light shading layer 300 and shaded, and may not influence the texture image; the light □ is reflected by the strong reflection interface 400 to the pinhole imaging area A, but its incident angle is too large, and it is filtered by the image sensor 200 and may not influence the texture image; and the light □ is reflected by the strong reflection interface 400 to the pinhole imaging area A, and its incident angle meets the angle condition at which the image sensor 200 receives the light, so the light □ may produce the serious interference on the texture image. As shown in FIG. 2, the continuous little white points 201 are the interference produced by the light □ on the texture image, shade the texture image, seriously influence the definition of the texture image, and lead to the problem of the inaccurate texture recognition.

Based on this, an embodiment of the disclosure provides a driving method of an OLED display panel, as shown in FIG. 3, which includes the following steps.

S301 is, in a texture recognition period, to control a first light emitting element in a texture recognition area to be in an off state, where the first light emitting element at least includes: a light emitting element of which the spacing from the edge of a pinhole imaging area is closest in the texture recognition area.

S302 is to obtain, by an image sensor, the image of an object formed through the pinhole imaging area, the object being in the texture recognition area and above the display panel.

Specifically, in the above driving method according to the embodiment of the disclosure, the pinhole imaging area is arranged at the gap between the light emitting elements, and the pinhole imaging area may be located at the center position of the gap, or may be located at the position which is closer to one of the light emitting elements and farther from other light emitting elements. The closer the distance of the edge of the light emitting element from the pinhole imaging area is, the larger the interference of the light, which is emitted by the light emitting element and reflected by the strong reflection interface into the pinhole imaging area, on the image sensor is. Thus, in the texture recognition period, the light emitting element closest to the edge of the pinhole imaging area is turned off to make it not emit light, which can reduce the light incoming to the image sensor by the reflection of the strong reflection interface, so that the interference on the texture image obtained by the image sensor is reduced, to make the gathered texture image clearer and to increase the accuracy of the texture recognition.

In some embodiments, in the above driving method, the light emitted by a ring of light emitting elements closest to the pinhole imaging area may be reflected by the strong reflection interface into the pinhole imaging area, and generate the interference on the image sensor. Thus, in the implementation, a ring of light emitting elements around the pinhole imaging area may be turned off, that is, a ring of light emitting elements near around the pinhole imaging area all are the first light emitting element.

In some embodiments, in the above driving method, as shown in FIG. 4, the first light emitting element includes: the light emitting elements 100 of which the spacings from the edge of the pinhole imaging area A are smaller than the preset spacing in the texture recognition area; the preset spacing L is determined by the following formula:

$$L = l_1 + l_2 = (x_1 + x_2) * \tan\theta$$

where $x_2$ is the distance between the strong reflection interface 400 in the OLED display panel and the upper surface of the light shading layer 300 having the pinhole imaging area A; $x_1$ is the distance between the strong reflection interface 400 in the OLED display panel and the upper surface of the light emitting element 100; and $\theta$ is the maximum angle at which the image sensor 200 in the OLED display panel receives the light.

Specifically, the maximum angle at which the image sensor 200 receives the light is generally 45°, and the maximum angle at which the current image sensor 200 receives the light is 38°. The value range of the $x_1$ and $x_2$ is generally between 20 μm and 300 μm. The current $x_1$ is generally about 145 μm and $x_2$ is generally about 150 μm, so $\theta$ may be selected as 38°. But the imaging angle for the image mosaic is generally 23°, so 38° may be used to determine the light emitting elements 100 required to be turned off. In some embodiments, in order to ensure the sufficient imaging light energy, $\theta$ is selected as 23° to calculate the range of the light emitting elements 100 required to be turned off. The size of one light emitting element is about 50 μm. Thus, as can be seen from the calculation, generally all the light emitted by two rings of light emitting elements 100 around the pinhole imaging area A may be reflected by the strong reflection interface 400 into the pinhole imaging area A.

In some embodiments, in the above driving method, in order to ensure the obtaining of the clear texture image, the first light emitting element includes: two rings of light emitting elements of which the center is the pinhole imaging area in the texture recognition area.

In some embodiments, in order to ensure that the sufficient light illuminates the texture located on the OLED display panel to make it reflect the light to the image sensor, in the above driving method according to the embodiment of the disclosure, the driving method further includes: in the texture recognition period, controlling a second light emitting element in the texture recognition area to be in the light emitting state, where the second light emitting element is other light emitting element than the first light emitting element in the texture recognition area. That is, not all the light emitting elements in the texture recognition area can be turned off in the texture recognition period, while it needs to remain a part of the light emitting elements to emit light. Moreover, in order to ensure the enough light energy for imaging, more light emitting elements are required to lighten, and $\theta$ may continue reducing according to the mosaic proportion requirement, that is, $\theta$ may be less than 23°.

In some embodiments, in the above driving method, in order to ensure that the sufficient light illuminates the texture located on the OLED display panel to make it reflect the light to the image sensor, the second light emitting element includes: at least one light emitting element located between two adjacent pinhole imaging areas in the texture recognition area. That is, in a plurality of light emitting elements between every two adjacent pinhole imaging areas, the light emitting element closer to the pinhole imaging area is taken as the first light emitting element and does not emit the light to avoid the interference on the texture image, and the light emitting element farther from the pinhole imaging area is taken as the second light emitting element and emits the light to provide the light required by the texture recognition.

Figure 6:
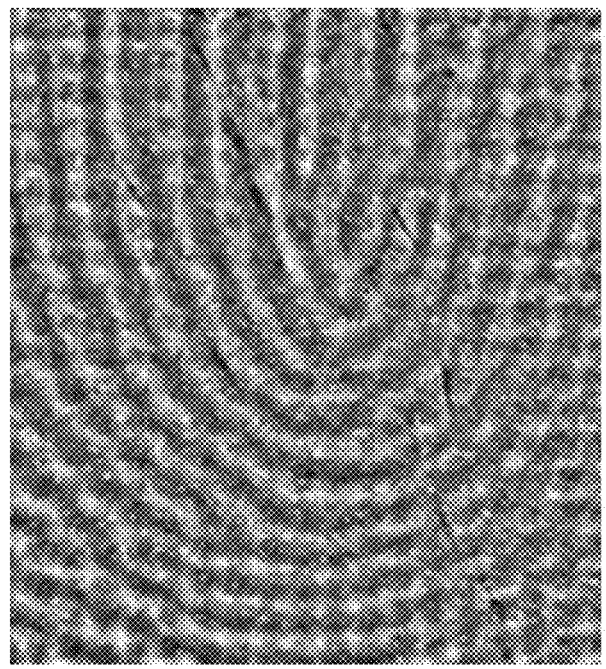
FIG. 6 is a schematic diagram of the texture image obtained by the driving method according to an embodiment of the disclosure.

In some embodiments, in the above driving method, in order to ensure the definition of the texture recognition, the number of the second light emitting elements between every two adjacent pinhole imaging areas is same in the texture recognition area. For example, as shown in FIG. 5, when a pinhole imaging area is arranged every eight light emitting elements, two rings of light emitting elements close to the pinhole imaging area may be set to the first light emitting elements, that is, in the eight light emitting elements, four light emitting elements are taken as the first light emitting elements 100a, and the other four light emitting elements are taken as the second light emitting elements 100b. Specifically, the obtained texture image is as shown in FIG. 6. As can be seen from the comparison with FIG. 2, the fingerprint texture is clearer, and no continuous little white points appear.

In some embodiments, in the OLED display panel, generally the pinhole imaging area can be set in the all screen to implement the all-screen texture recognition function. Based on this, in the above driving method according to the embodiment of the disclosure, the driving method further includes: determining the texture recognition area in the display area of the OLED display panel, i.e., taking the local area in the display area as the texture recognition area. The local area may be the preset specified area, for example, it is indicated that the lower right corner of the screen is taken as the texture recognition area; or the local area may be the area determined according to the finger pressing position, that is, the area pressed by the finger randomly is determined as the texture recognition area. Thus, after the texture recognition area is determined, the steps S301 and S302 can be performed in the texture recognition area. For the other areas of the display area, the normal display is performed.

Or, the whole display area of the OLED display panel is directly taken as the texture recognition area. That is, the steps S301 and S302 are performed directly for all the pinhole imaging areas in the display area.

In some embodiments, in the above driving method, the texture recognition area is determined in the display area of the OLED display panel, which can be implemented by: firstly determining a touch area according to a touch module in the OLED display panel; and then taking the touch area as the texture recognition area.

Specifically, when there is the touch module in the OLED display panel, the touch area may be determined according to the touch position identified by the touch module, and then the touch area is taken as the texture recognition area. Of course, when no touch module is integrated in the OLED display panel, the texture recognition area may also be judged roughly through the data obtained by the image sensor, and then the steps S301 and S302 are performed to obtain the clear texture image.

Based upon the same inventive concept, an embodiment of the disclosure further provides an OLED display panel. Since the principle solving the problem of this OLED display panel is similar to that of the above driving method, the implementations of this OLED display panel can refer to the implementations of the driving method, and the repeated description thereof will be omitted here.

Specifically, an OLED display panel according to an embodiment of the disclosure is driven by the above driving method according to the embodiment of the disclosure. As shown in FIG. 4, the OLED display panel includes: a plurality of light emitting elements 100, an image sensor 200, a light shading layer 300 located between the image sensor 200 and a layer where the light emitting elements 100 is located and having at least one pinhole imaging area A, and a strong reflection interface 400 located at one side of the light emitting elements 100 away from the light shading layer 300. The at least one pinhole imaging area A is located at the gaps among all the light emitting elements 100.

The image sensor 200 is configured, in a texture recognition period, to obtain the image of an object formed through the pinhole area, the object being above the display pane. In the texture recognition period, a first light emitting element in a texture recognition area is in the off state, the first light emitting element includes at least a light emitting element 100 of which the spacing from the edge of the pinhole imaging area A is closest in the texture recognition area.

In some embodiments, in the above OLED display panel, the OLED display panel further includes: a touch module located at one side of the light emitting elements 100 away from the light shading layer 300, where the touch module is taken as the strong reflection interface 400. Of course, in a specific implementation, the case that another component module arranged on the light emitting element 100 of the OLED display panel is taken as the strong reflection interface 400 is not excluded.

Based upon the same inventive concept, an embodiment of the disclosure further provides a display device, which includes any OLED display panel described above and provided by the embodiments of the disclosure. The display device may be a mobile phone, a tablet, a television, a display, a laptop, a digital photo frame, a navigator, or any other product or component with display functions. The implementations of this display device can refer to the embodiments of the above-mentioned OLED display panel, and the repeated description thereof will be omitted here.

For the above OLED display panel, driving method thereof and display device according to the embodiments of the disclosure, in a texture recognition period, the first light emitting element in the texture recognition area is controlled to be in the off state, where the first light emitting element at least includes: the light emitting element of which the spacing from the edge of the pinhole imaging area is closest in the texture recognition area; and then the image of the object through the pinhole imaging area is obtained by the image sensor, the object being in the texture recognition area and above the display panel, so as to implement the texture gathering and recognition functions. Since the light emitting element closest to the pinhole imaging area is turned off to make it not emit light, the light incoming to the image sensor by the reflection of the strong reflection interface can be reduced, so that the interference on the texture image obtained by the image sensor is reduced, to make the gathered texture image clearer and to increase the accuracy of the texture recognition.

Evidently those skilled in the art can make various modifications and variations to the disclosure without departing from the spirit and scope of the disclosure. Thus the disclosure is also intended to encompass these modifications and variations therein as long as these modifications and variations come into the scope of the claims of the disclosure and their equivalents.

What is claimed is:

1. A driving method of an Organic Light Emitting Diode (OLED) display panel, comprising:
   in a texture recognition period, controlling a first light emitting element in a texture recognition area to be in an off state, wherein the first light emitting element comprises at least a light emitting element of which a spacing from an edge of a pinhole imaging area is closest in the texture recognition area; and
   obtaining, by an image sensor, an image of an object formed through the pinhole imaging area, the object being in the texture recognition area and above the display panel;
   wherein the first light emitting element comprises all light emitting elements of which spacings from the edge of the pinhole imaging area are smaller than a preset spacing in the texture recognition area; the preset spacing is determined according to a distance between a strong reflection interface in the OLED display panel and an upper surface of a light shading layer having the pinhole imaging area, a distance between the strong reflection interface in the OLED display panel and an upper surface of the light emitting element, and a maximum angle at which the image sensor in the OLED display panel receives light.

2. The driving method of claim 1, wherein the preset spacing L is determined by a following formula:

$$L=(x_1+x_2)*\tan\theta$$

wherein $x_2$ is the distance between the strong reflection interface in the OLED display panel and the upper surface of the light shading layer having the pinhole imaging area; $x_1$ is the distance between the strong reflection interface in the OLED display panel and the upper surface of the light emitting element; and $\theta$ is the maximum angle at which the image sensor in the OLED display panel receives light.

3. The driving method of claim 2, wherein the first light emitting element comprises two rings of light emitting elements of which the center is the pinhole imaging area in the texture recognition area.

4. The driving method of claim 3, further comprising:
in the texture recognition period, controlling a second light emitting element in the texture recognition area to be in a light emitting state, wherein the second light emitting element is another light emitting element than the first light emitting element in the texture recognition area.

5. The driving method of claim 3, further comprising:
determining the texture recognition area in a display area of the OLED display panel; or taking a whole display area of the OLED display panel as the texture recognition area.

6. The driving method of claim 2, further comprising:
in the texture recognition period, controlling a second light emitting element in the texture recognition area to be in a light emitting state, wherein the second light emitting element is another light emitting element than the first light emitting element in the texture recognition area.

7. The driving method of claim 2, further comprising:
determining the texture recognition area in a display area of the OLED display panel; or taking a whole display area of the OLED display panel as the texture recognition area.

8. The driving method of claim 1, further comprising:
in the texture recognition period, controlling a second light emitting element in the texture recognition area to be in a light emitting state, wherein the second light emitting element is another light emitting element than the first light emitting element in the texture recognition area.

9. The driving method of claim 8, wherein the second light emitting element comprises at least one light emitting element located between two adjacent pinhole imaging areas in the texture recognition area.

10. The driving method of claim 9, wherein in the texture recognition area, the number of the second light emitting elements between every two adjacent pinhole imaging areas is same.

11. The driving method of claim 1, further comprising:
determining the texture recognition area in a display area of the OLED display panel; or taking a whole display area of the OLED display panel as the texture recognition area.

12. The driving method of claim 11, wherein determining the texture recognition area in the display area of the OLED display panel, comprises:
determining a touch area according to a touch module in the OLED display panel; and
taking the touch area as the texture recognition area.

13. An Organic Light Emitting Diode (OLED) display panel, which is driven by the driving method of claim 1, wherein the OLED display panel comprises: a plurality of light emitting elements, an image sensor, a light shading layer located between the image sensor and a layer where the light emitting elements are located and having at least one pinhole imaging area, and a strong reflection interface located at one side of the light emitting elements away from the light shading layer; wherein:
the at least one pinhole imaging area is located at gaps among the light emitting elements;
the image sensor is configured, in a texture recognition period, to obtain an image of an object formed through the pinhole imaging area, the object being above the display panel; wherein in the texture recognition period, a first light emitting element in a texture recognition area is in an off state, the first light emitting element comprises at least a light emitting element of which a spacing from an edge of the pinhole imaging area is closest in the texture recognition area;
wherein the first light emitting element comprises all light emitting elements of which spacings from the edge of the pinhole imaging area are smaller than a preset spacing in the texture recognition area; the preset spacing is determined according to a distance between a strong reflection interface in the OLED display panel and an upper surface of a light shading layer having the pinhole imaging area, a distance between the strong reflection interface in the OLED display panel and an upper surface of the light emitting element, and a maximum angle at which the image sensor in the OLED display panel receives light.

14. The OLED display panel of claim 13, further comprising: a touch module located at one side of the light emitting elements away from the light shading layer, wherein the touch module is served as the strong reflection interface.

15. The OLED display panel of claim 13, wherein the preset spacing L is determined by a following formula:

$$L=(x_1+x_2)*\tan\theta$$

wherein $x_2$ is the distance between the strong reflection interface in the OLED display panel and the upper surface of a light shading layer having the pinhole imaging area; $x_1$ is the distance between the strong reflection interface in the OLED display panel and the upper surface of the light emitting element; and $\theta$ is the maximum angle at which the image sensor in the OLED display panel receives light.

16. The OLED display panel of claim 15, wherein the first light emitting element comprises two rings of light emitting elements of which the center is the pinhole imaging area in the texture recognition area.

17. A display device, comprising an Organic Light Emitting Diode (OLED) display panel, which is driven by the driving method of claim 1, wherein the OLED panel comprises: a plurality of light emitting elements, an image sensor, a light shading layer located between the image sensor and a layer where the light emitting elements are located and having at least one pinhole imaging area, and a strong reflection interface located at one side of the light emitting elements away from the light shading layer; wherein:
the at least one pinhole imaging area is located at gaps among the light emitting elements;
the image sensor is configured, in a texture recognition period, to obtain an image of an object formed through the pinhole imaging area, the object being above the display panel; wherein in the texture recognition period, a first light emitting element in a texture recognition area is in an off state, the first light emitting element comprises at least a light emitting element of which a spacing from an edge of the pinhole imaging area is closest in the texture recognition area;
wherein the first light emitting element comprises all light emitting elements of which spacings from the edge of the pinhole imaging area are smaller than a preset spacing in the texture recognition area; the preset spacing is determined according to a distance between a strong reflection interface in the OLED display panel and an upper surface of a light shading layer having the pinhole imaging area, a distance between the strong reflection interface in the OLED display panel and an upper surface of the light emitting element, and a maximum angle at which the image sensor in the OLED display panel receives light.

18. The display device of claim 17, wherein the OLED display panel further comprises: a touch module located at one side of the light emitting elements away from the light shading layer, wherein the touch module is served as the strong reflection interface.

19. The display device of claim 17, wherein the preset spacing L is determined by a following formula:

$$L=(x_1+x_2)*\tan\theta$$

wherein $x_2$ is the distance between the strong reflection interface in the OLED display panel and the upper surface of a light shading layer having the pinhole imaging area; $x_1$ is the distance between the strong reflection interface in the OLED display panel and the upper surface of the light emitting element; and $\theta$ is the maximum angle at which the image sensor in the OLED display panel receives light.

20. The display device of claim 19, wherein the first light emitting element comprises two rings of light emitting elements of which the center is the pinhole imaging area in the texture recognition area.

* * * * *